United States Patent [19]
Yoshida

[11] Patent Number: 5,584,401
[45] Date of Patent: Dec. 17, 1996

[54] SUBSTRATE-SUPPORTING SIDE BOARDS AND A CASSETTE UTILIZING THE BOARDS

[75] Inventor: Toshio Yoshida, Higashi-Osaka, Japan

[73] Assignee: Yodogawa Kasei Kabushiki Kaisha, Osaka, Japan

[21] Appl. No.: 507,636

[22] Filed: Jul. 25, 1995

[30] Foreign Application Priority Data

Jul. 29, 1994 [JP] Japan ..................... 6-197325

[51] Int. Cl.⁶ ..................................... A47F 5/00
[52] U.S. Cl. ........................... 211/41; 206/454; 134/902; 118/500
[58] Field of Search .............................. 211/41; 206/454; 118/500; 134/902

[56] References Cited

U.S. PATENT DOCUMENTS

| | | | |
|---|---|---|---|
| 4,872,554 | 10/1989 | Quernomoen | 211/41 X |
| 5,154,301 | 10/1992 | Kos | 206/454 X |
| 5,370,142 | 12/1994 | Nishi et al. | 118/500 X |
| 5,492,229 | 2/1996 | Tanaka et al. | 211/41 |
| 5,503,173 | 4/1996 | Kudo et al. | 211/41 X |
| 5,534,074 | 7/1996 | Koons | 206/454 X |

FOREIGN PATENT DOCUMENTS 3-133153  6/1991  Japan .

Primary Examiner—Robert W. Gibson, Jr.
Attorney, Agent, or Firm—Armstrong, Westerman, Hattori, McLeland & Naughton

[57] ABSTRACT

The invention provides a cassette which is sufficiently sturdy even though its side boards are of narrow width, is protected against static charging in the insertion and removal of substrates and, hence, against circuit failure, and is not liable to form a dust of friction. The invention further provides an improved substrate-supporting side board for use in the fabrication of a cassette.

The above substrate-supporting side board comprises a metal core, an overlay and a plurality of shelf members, at least the frontal part of the overlay and the shelf members being made of resin, the shelf members being tongue-shaped projections arising from the overlay and extending in parallel and inwardly of the cassette frame at a predetermined pitch with an upward inclination toward free ends thereof, the supporting surface of each shelf member being slightly elevated in the center with respect to its flanks, and at least part of the portion of the resin which is to contact a substrate being molded from a dust-inhibited resin molding material, with the remainder being molded from an electrically conductive resin molding material.

7 Claims, 6 Drawing Sheets

SUBSTRATE-SUPPORTING SIDE BOARDS AND A CASSETTE UTILIZING THE BOARDS

TECHNICAL FIELD

The present invention relates to a cassette for accommodating a plurality of substrates in mutual isolation. The invention further relates to a substrate-supporting side board which is to be a functional member of said cassette.

BRIEF DESCRIPTION OF THE PRIOR ART

Substrates such as glass substrates must be stored and taken out from a cassette in such a manner that the plural substrates will not contact with each other.

The cassette in common use comprises a box-shaped resin frame equipped with pairs of opposed resin side members each formed with grooves (substrate-supporting side boards) so that one and each substrate may be accommodated between grooves of the opposed side boards. While such grooved side boards are available in various shapes and designs, all are basically such that a plurality of rib-shaped shelf members project in parallel at a predetermined pitch from the back of the side board. The clearance between adjacent rib-shaped shelf members constitute the groove for accepting the substrate.

Several known cassettes of this type are described in JP Kokai H 2-295159, JP Kokai H 3-133152, JP Kokai H 3-133153, JP Kokai H 3-268343, JP Kokai H 3-268344, and JP Kokai H 4-245453, among others.

In addition, JP Kokai S 62-247328 discloses the use of a cassette molded from polyetheretherketone as a vessel for use in the manufacture of glass substrates for liquid crystal display use and JP Kokai S 62-247329 describes the use of a vessel molded from polyetheretherketone as a container for thin-film semiconductive substrates for surface display drive use.

The conventional cassette inclusive of grooved side boards is entirely made of a resin material. Therefore, in order that the cassette may have sufficient strength, the width of the grooved side boards must be broad enough (for example, 100 mm). However, such construction results in increased overall weight despite the cassette being entirely made of resin.

Moreover, because said side boards are made of resin, static electricity is generated due to friction in the insertion and removal of the substrate or transport of the cassette and particularly where the substrate is a glass substrate for TFT liquid crystal use, the transistor may undergo static breakdown.

In regard to the latter problem of static electricity, it might be contemplated to fabricate the grooved side board using a resin composition containing an electrically conductive filler such as metal filaments, metal powder, carbon fiber or carbon powder but any side board molded from a resin composition containing such an electrically conductive filler is liable to form dusts due to friction against the substrate being inserted or withdrawn so that even if the object of prevention of static electricity may be accomplished, the cassette is not suited for accommodating electronic substrates.

It might also be contemplated to fabricate the grooved side board as a whole using a metallic material but as the substrate comes into direct contact with the metallic shelves of the grooved side board, dusts of friction are formed owing to friction of the shelf against the edge of the substrate. Moreover, when the grooved side board is entirely made of metal, a current flows immediately on contact with a charged object to cause transistor breakdown and other circuit troubles.

It is an object of the present invention to provide a cassette which is sufficiently sturdy even though its side boards are of narrow width, is protected against static charging in the insertion and removal of substrates and, even if it is charged, the charge is attenuated only gradually so as to prevent a circuit failure, and is not liable to form dusts such as the dust of friction due to friction against substrates. It is a further object of the invention to provide an improved substrate-supporting side board for use in the fabrication of a cassette.

SUMMARY OF THE INVENTION

The substrate-supporting side board of the present invention comprises a metal core, an overlay and a plurality of shelf members, at least the frontal part of said overlay and the shelf members being made of resin, said shelf members being tongue-shaped projections arising from said overlay and extending in parallel and inwardly of the cassette at a predetermined pitch with an upward inclination toward free ends thereof, the supporting surface of each of said shelf members being slightly elevated in the center with respect to its flank parts, and at least part of the portion of said resin which is to contact a substrate being molded from a dust-inhibited resin with the remainder of said resin being molded from an electrically conductive resin.

The cassette of the present invention comprises a frame and a plurality of substrate-supporting side boards as configured in the overall shape of a box for accommodating a substrate in the clearance between shelf members of each pair of said side boards opposedly disposed, the substrate-supporting side boards being units of the substrate-supporting side board described above.

DETAILED DESCRIPTION OF THE INVENTION

Figure 1:
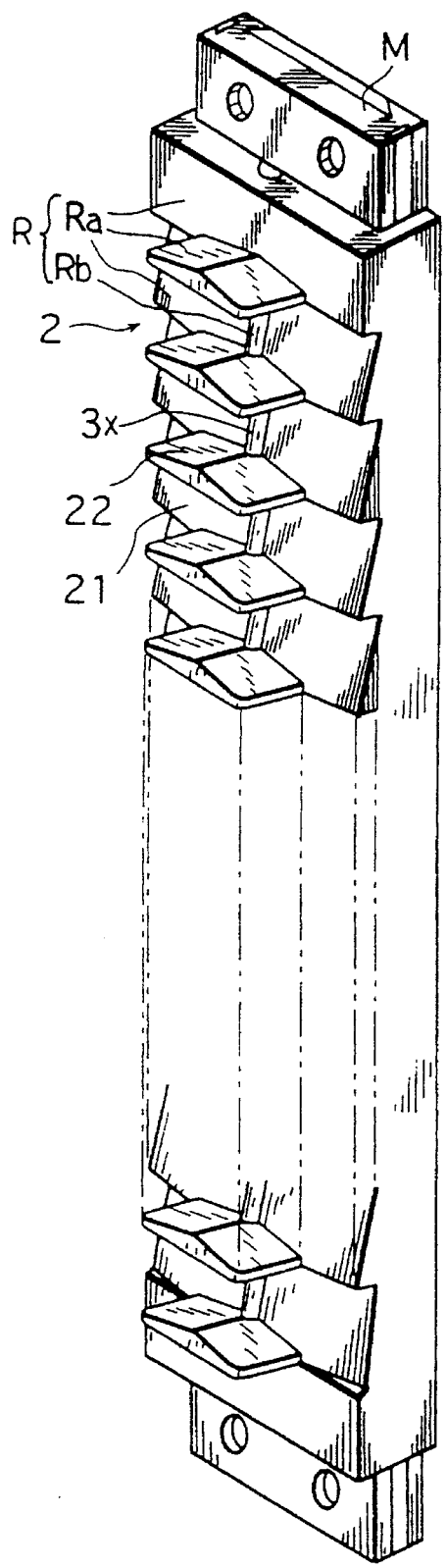
FIG. 1 is a perspective view showing a typical substrate-supporting side board 2 according to the invention.

The present invention is now described in detail.

The cassette according to the present invention comprises a frame 1 and a plurality of substrate-supporting side boards 2, 2 as assembled in a box-shaped overall configuration, with said substrate-supporting side boards 2, 2 being disposed in pairs on opposed sides of the box.

The frame 1 comprises a bottom board 11, a ceiling board 12, and a stopper board 13 adapted to delimit the stroke of substrates 0. In lieu of the stopper board 13, the back wall of the cassette or the substrate-supporting side boards 2 in the innermost position may be provided with suitable stop means. The frame 1 may be made of resin or metal.

The number of substrate-supporting side boards 2, 2 should be two at the minimum on either side of the box and is generally 3–4 per side. The width of the substrate-supporting side board 2 is preferably narrow (e.g. not more than 60 mm) for reduced cassette weight.

In accordance with the present invention, said substrate-supporting side board 2 has the following structural features.

Thus, a plurality of tongue-shaped shelf members 22 extend inwardly and in parallel at a predetermined pitch from an overlay portion 21 of the side board 2. Preferably the surface of the overlay 21 in each stage is inclined with its upper part projecting forward with respect to its lower part. Moreover, the surface of said overlay 21 is preferably tapered with its centerline area projecting slightly with respect to its flank areas.

The tongue-shaped shelf member 22 mentioned above is configured and disposed at an upward inclination toward its free end. The angle of inclination may for example be about 1°–30°, preferably 2°–15°.

In addition, the supporting surface of said tongue-shaped shelf member 22 is shaped like a hill with the central part thereof being somewhat elevated from its both edges. The angle of inclination of the hill may for example be about 1°–30°, preferably 2°–15°. The ridge of the hill, that is to say the free end portion of the hill, may be somewhat rounded off or flattened.

The above construction of the tongue-shaped shelf member 22 leads to a marked decrease in friction at insertion or removal of the substrate 0.

Further, in accordance with the present invention, the core portion of the substrate-supporting side board 2 is made of metal M with at least the front side of said overlay 21 and the tongue-shaped member 22 being made of resin R, and of said resin R, at least part of the portion which is to contact the substrate 0 being formed of a dust-inhibited resin Rb with the remainder of R being made of an electrically conductive resin Ra.

The metal M may for example be aluminum or stainless steel.

The electrically conductive resin Ra of R is a dispersion of a particulate electrically conductive substance in a matrix resin.

The matrix resin that can be used includes but is not limited to polyetheretherketone, polyetherimide, polyimide, polyamideimide, polyphenylene sulfide, polyarylate, polysulfone, polyarylsulfone, polyethersulfone, polyphenylene ether sulfone, modified polyphenylene oxide, polyetheramide, perfluoroalkoxy-substituted polytetrafluoroethylene, polypropylene, polybutylene terephthalate, polycarbonate, acrylonitrile polymer, ethylene-vinyl alcohol copolymer and polyamide.

The electrically conductive substance includes but is not limited to metal filaments, metal powder, carbon fiber, carbon black, graphite, and ionic polymers.

The volume resistivity of said electrically conductive resin Ra is preferably $10^4$–$10^{11}\Omega$, and for still better results, $10^5$–$10^9\Omega$.

The dust-inhibited resin Rb is a viscous resin such as polyetherketone, polyetherimide or the like. The member molded from such resin hardly generates dusts even when brought into contact with the edge or back of the substrate 0, e.g. a glass substrate.

The following methods can be used for molding at least part of the overlay 21 and the tongue-shaped shelf member 22 which are to contact the substrate 0 using a dust-inhibited resin Rb.

(a) The overlay 21 is provided with a rib-like projection 3x extending centrally and longitudinally and this projection 3x is molded from dust-inhibited resin Rb.

(b) The ridge of the tongue-shaped shelf member 22 is provided with a rib-like projection 3y and this projection 3y is molded from dust-inhibited resin Rb.

(c) The overlay 21 is provided with a projection displaced slightly forward from the ground area and this projection 3z is molded from dust-inhibited resin Rb. For example, the overlay 21 is provided with a central projecting portion 3z displaced slightly forward from its flank areas and this portion 3z is molded from dust-inhibited resin Rb.

(d) The resin R constituting the tongue-shaped shelf member 22 is molded from dust-inhibited resin Rb.

While it is sufficient to follow one of the above procedures, two or more of the procedures, e.g. a+b or c+d, may be used in combination.

The following methods, among others, can be used to fabricate a side board using a meal core M and said dust-inhibited resin Rb and electrically conductive resin Ra.

(1) The projection members 3x, 3y and 3z made of dust-inhibited resin Rb are fitted into precut grooves of the metal core M and the electrically conductive resin Ra is injection-molded over the assembly.

(2) In injection-molding the electrically conductive resin Ra using the metal core M as an outsert or an insert, the dust-inhibited resin Rb is double (two-stage)-molded.

The substrate 0 that can be accommodated in the above cassette includes a variety of substrates inclusive of glass substrates.

The cassette of the present invention features substrate-supporting side boards 2 structurally characterized in that tongue-shaped members 22 extend horizontally and inwardly at a predetermined pitch from a back portion 21, with each of said tongue-shaped members being inclined upwards toward its free end and configured in the shape of a hill with its supporting surface being somewhat raised centrally with respect to its flank parts.

Therefore, the substrate 0 is supported substantially at the vertex of the hill which is situated at the free end of the tongue-shaped supporting member 22 so as to structurally preclude formation of dust due to wear in the insertion and removal of substrates 0 or the transport of the cassette.

In addition, material-wise, the substrate-supporting side board 2 according to the present invention comprises a metal core M, an overlay and a plurality of tongue-shaped shelf members, at least the frontal part of the overlay 21 and the tongue-shaped supporting members 22 being molded from resin R and at least part of the portion of the resin molding which is to contact the substrate 0 being molded from a dust-inhibited resin Rb with the remainder of the resin member R being molded from an electrically conductive resin Ra.

Therefore, even if the width of the substrate-supporting side board 2 is narrow, a sufficient degree of strength may be insured.

Furthermore, static charging during hardling of substrates 0 is effectively precluded by the presence of said metal core M and electrically conductive resin Ra and even if static charge is generated, attenuation occurs gradually at a constant rate of 0.5–1 second so that the risk of circuit trouble is prevented. Incidentally if the substrate-supporting side board 2 is entirely made of metal, a current flows instantly upon contact with a charged material.

Moreover, since at least part of the portion of the resin member R which is to contact a substrate 0 is molded from a dust-inhibited resin Rb, there is no generation of dust on contact with the edge or back of the substrate 0.

Preferred embodiments of the invention are now described in detail.

The first embodiment is now described with reference to FIGS. 1–3.

Figure 3:
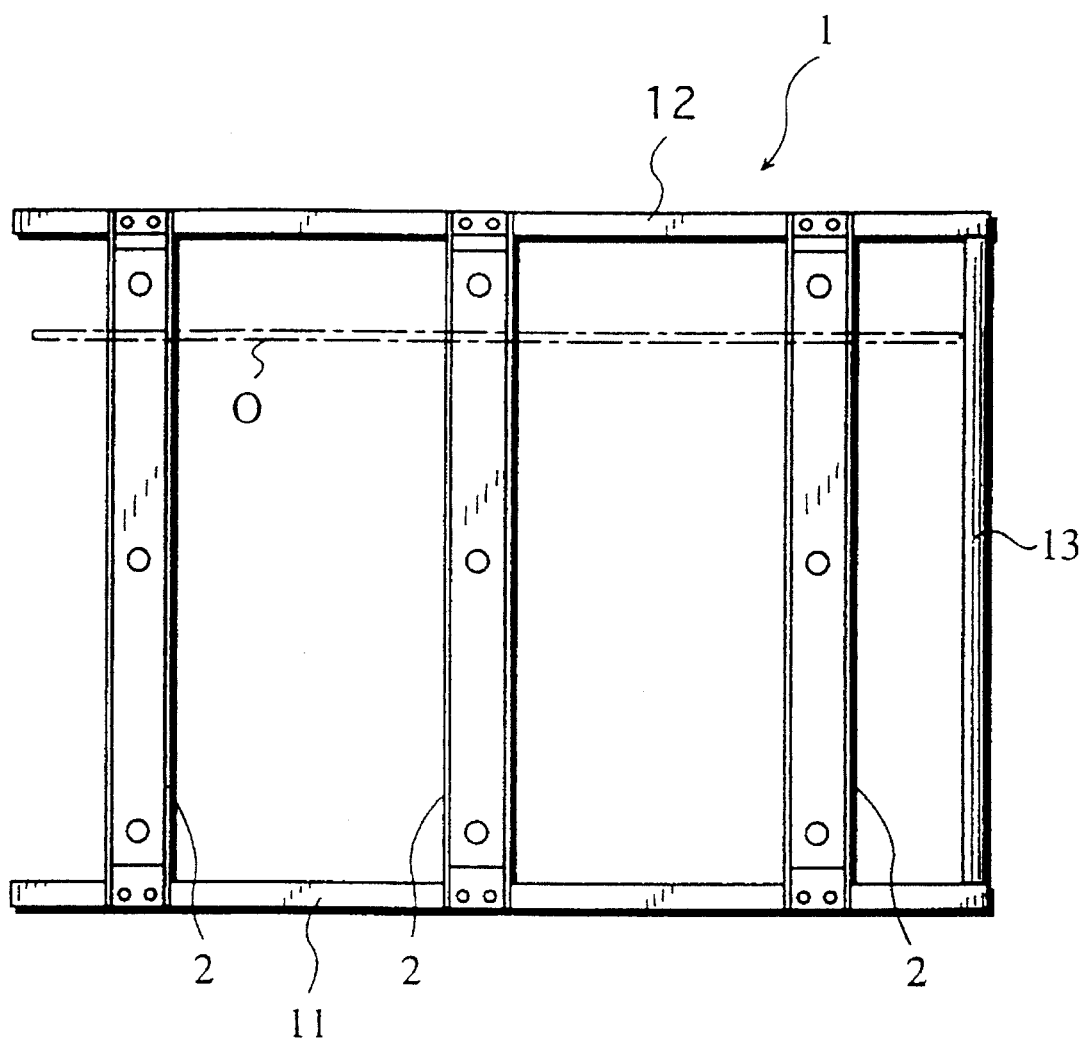
FIG. 3 is a side elevation view showing a typical cassette according to the invention.

Referring to FIG. 3, a frame 1 comprises a bottom member 11, a ceiling member 12 and a stopper member 13. The bottom member 11 and ceiling member 12 are molded from the dust-inhibited resin and electrically conductive resin Ra to be described hereinafter, respectively. The stopper member 13 comprises a SUS304 metal rod inserted tight into the axial bore of an extruded polytetrafluoroethylene member.

The reference numeral 2 represents a substrate-supporting side board. Three units of the side board 2 are screwed to each of the opposed sides of the frame, spanning the bottom member 11 and ceiling member 12. Indicated by dot-dash lines in FIG. 3 is a substrate 0 set in the clearance between shelf members 22, 22 of the opposed substrate-supporting side boards 2, 2.

Figure 2:
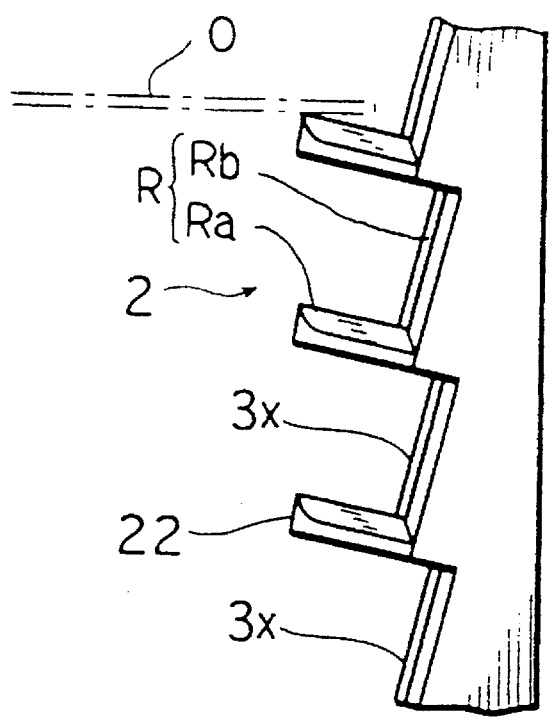
FIG. 2 is a side elevation view of said substrate-supporting side board 2.

The substrate-supporting side board 2 illustrated in FIGS. 1 and 2 is a metal-resin composite board produced by injection-molding a polyetheretherketone (or polyetherimide) containing carbon fiber (or kitchen black, graphite or the like), as a typical electrically conductive resin Ra, using an aluminum alloy, as said metal M, as an outsert. The volume resistivity of the resin member R molded from the electrically conductive resin Ra is controlled within the range of $10^5$–$10^9 \Omega$.

The substrate-supporting side board 2 is structurally characterized in that tongue-shaped shelf members 22 project in parallel and inwardly of the cassette frame at a predetermined pitch from the overlay surface 21. In the illustrated embodiment, the width of the overlay 21 is 30 mm and the width of the shelf member is 18 mm.

The tongue-shaped shelf members 22 of the substrate-supporting side board 2 are disposed at an upward inclination toward the respective free ends at an angle of 5° from their bases. The free end of each shelf member 22 is rounded. The supporting surface of the shelf member 22 is configured in the manner of a hill with its center elevated with respect to both sides and the angle of inclination is set at 5°.

The overlay part of the substrate-supporting side board 2 is inclined between adjacent tongue-shaped shelf members as illustrated in FIG. 2.

The overlay portion 21 is centrally provided with a longitudinally extending ridge-like projection 3x made of polyetheretherketone as an example of said dust-inhibited resin Rb.

This cassette is comparatively light-weight and even when it is loaded with TFT liquid crystal glass substrates, generation of static electricity is positively precluded so that the transistor failure can be prevented. Moreover, formation of dusts of friction due to fractional contact with the substrate 0 is minimized or even completely inhibited.

Figure 4:
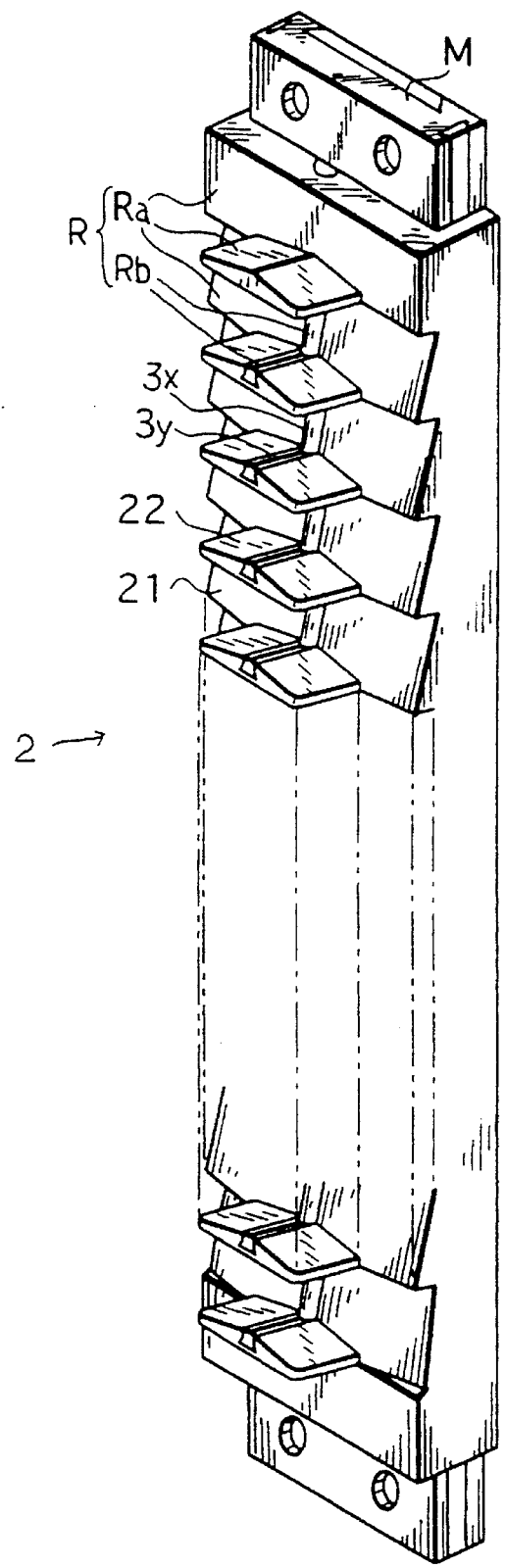
FIG. 4 is a perspective view showing another typical substrate-supporting side board 2 according to the invention.

The second embodiment of the present invention is now described with reference to FIG. 4.

In this second embodiment, the overlay portion 21 is centrally provided with a longitudinally extending rib-shaped projection 3x just as in the first embodiment and, moreover, the ridge portion of the supporting surface of the tongue-shaped shelf member 22 is also provided with a rib-shaped projection 3y made of dust-inhibited resin Rb.

Figure 5:
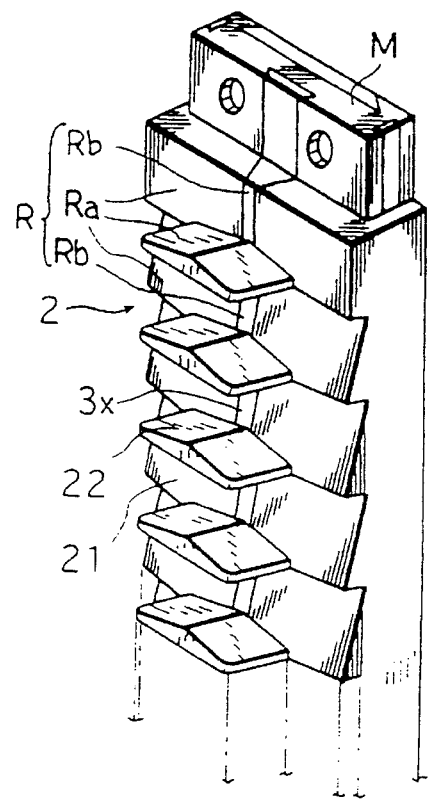
FIG. 5 is a partially perspective view showing still another typical substrate-supporting side board according to the invention.
Figure 6:
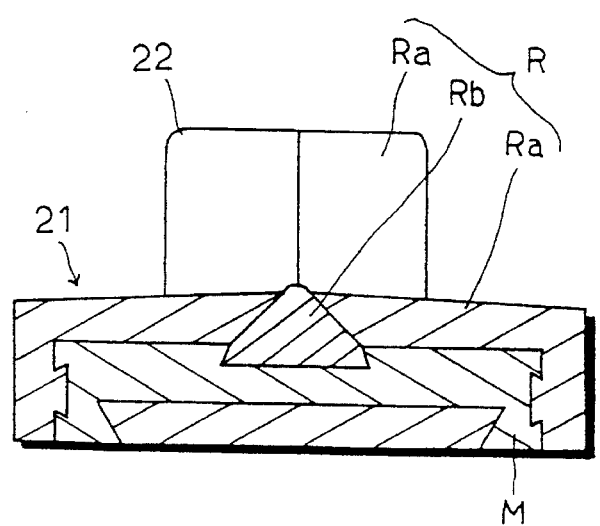
FIG. 6 is a transverse section view of said substrate-supporting side board.

The third embodiment of the invention is now described with reference to FIGS. 5 and 6.

In this third embodiment, the overlay 21 is centrally provided with a longitudinally extending rib-shaped projection 3x made of dust-inhibited resin Rb.

Figure 7:
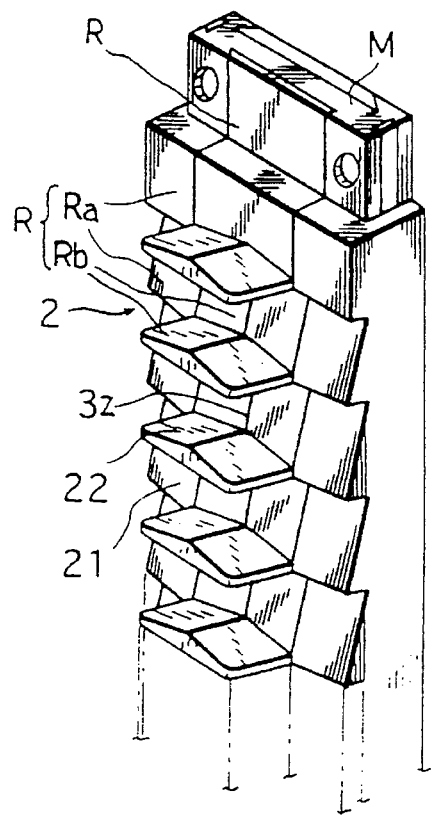
FIG. 7 is a partially perspective view showing still another typical substrate-supporting side board according to the invention.
Figure 8:
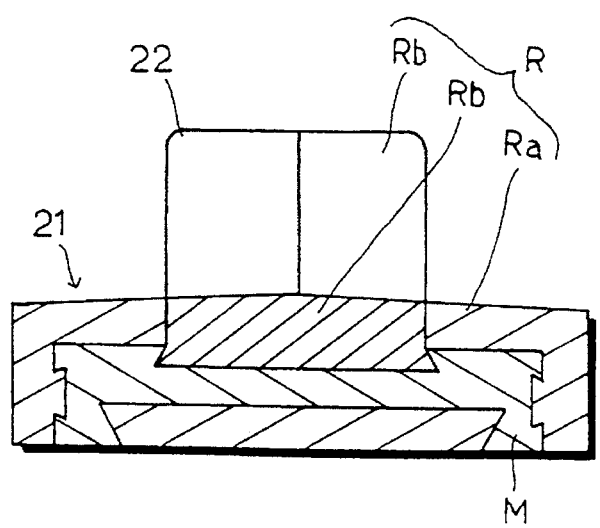
FIG. 8 is a transverse section view of the substrate-supporting side board 2 shown in FIG. 7.

The forth embodiment of the present invention is illustrated in FIGS. 7 and 8.

In this embodiment, the central region of the overlay 21 is provided with a broad-width projection 3z extending forwardly of its flank regions and this projection 3z is molded from dust-inhibited resin Rb. In addition, the shelf members 22 are also molded from the dust-inhibited resin Rb.

Because of the above structural features of the substrate-supporting side board 2, the substrate is supported substantially at one vertex of the hill-shaped structure at the free end of the shelf member so that formation of dusts such as dusts of friction associated with the insertion and removal of substrates is structurally precluded.

Furthermore, since the substrate-supporting side board is uniquely and strategically constructed of suitable materials, the cassette has sufficient strength even though the width of the side boards is small. The static charging associated with the insertion and removal of substrates is also effectively inhibited and even if static electricity is generated, it is attenuated gradually at a constant rate of 0.5–1 seconds so that the occurrence of circuit failure is precluded. In addition, the formation of dusts on contact with the edge or back of the substrate is minimized.

What is claimed is:

1. A substrate-supporting side board to be assembled with a cassette frame for supporting substrates which comprises a metal core, an overlay and a plurality of shelf members, at least the frontal part of said overlay and the shelf members being made of resin, said shelf members being tongue-shaped projections arising from said overlay and extending in parallel and inwardly of the cassette at a predetermined pitch with an upward inclination toward the free ends thereof, the supporting surface of each of said shelf members being slightly elevated in the center from its flank parts, and at least part of the portion of the resin which is to contact substrates being molded from a dust-inhibited resin molding material with the remainder of said resin being molded from an electrically conductive resin molding material.

2. The substrate-supporting side board according to claim 1 wherein said overlay is provided with a rib-like projection extending centrally in a longitudinal direction, said projection being molded from said dust-inhibited resin.

3. The substrate-supporting side board according to claim 1 wherein each of said shelf members is provided with a rib-like projection along the ridge of a hill-shaped supporting surface, said projection being molded from said dust-inhibited resin.

4. The substrate-supporting side board according to claim 1 wherein said overlay is provided with a projection slightly extending forwards from a ground surface thereof, said projection being molded from said dust-inhibited resin.

5. The substrate-supporting side board according to claim 1 wherein the resin constituting said shelf members is molded from said dust-inhibited resin.

6. The substrate-supporting side board according to claim 1 wherein said overlay is projecting forward at its upper part of each stage with respect to its lower part.

7. A cassette comprising a frame and a plurality of substrate-supporting side boards as configured in the overall shape of a box for accommodating a substrate in the clearance between shelf members of each opposed pair of said side boards, the substrate-supporting side boards being units of the substrate-supporting side board claimed in any of claims 1 through 6.

* * * * *